(12) United States Patent
Goto et al.

(10) Patent No.: US 11,380,602 B2
(45) Date of Patent: Jul. 5, 2022

(54) PLATING FILM AND PLATED MEMBER

(71) Applicants: Sumitomo Electric Industries, Ltd., Osaka (JP); A.L.M.T. Corp., Tokyo (JP)

(72) Inventors: Kengo Goto, Osaka (JP); Akihisa Hosoe, Osaka (JP); Tadashi Arikawa, Sakata (JP); Hiroya Sato, Sakata (JP); Masatoshi Nagashima, Sakata (JP); Shohei Murakami, Sakata (JP)

(73) Assignees: Sumitomo Electric Industries, Ltd., Osaka (JP); A.L.M.T. CORP., Tokyo (JP)

( * ) Notice: Subject to any disclaimer, the term of this patent is extended or adjusted under 35 U.S.C. 154(b) by 21 days.

(21) Appl. No.: 16/977,841

(22) PCT Filed: Feb. 26, 2019

(86) PCT No.: PCT/JP2019/007181
§ 371 (c)(1),
(2) Date: Sep. 3, 2020

(87) PCT Pub. No.: WO2019/172010
PCT Pub. Date: Sep. 12, 2019

(65) Prior Publication Data
US 2021/0013122 A1    Jan. 14, 2021

(30) Foreign Application Priority Data
Mar. 7, 2018   (JP) .............................. JP2018-041281

(51) Int. Cl.
*H01L 23/373*      (2006.01)
*C25D 3/48*        (2006.01)
(Continued)

(52) U.S. Cl.
CPC .......... *H01L 23/3735* (2013.01); *B32B 15/01* (2013.01); *B32B 15/017* (2013.01);
(Continued)

(58) Field of Classification Search
CPC ..... H01L 21/60; H01L 23/3735; B32B 15/04; B32B 15/01; B32B 15/043; B32B 15/017;
(Continued)

(56) References Cited

U.S. PATENT DOCUMENTS

2002/0162748 A1    11/2002  Kobori et al.
2011/0117736 A1*    5/2011  Kanaoka ................. C25D 3/48
                                                    438/613
2015/0137356 A1     5/2015  Tsuyuki et al.

FOREIGN PATENT DOCUMENTS

JP    S62-151592 A    7/1987
JP    H01-239856 A    9/1989
(Continued)

OTHER PUBLICATIONS

W. L. Holstein, "Thermodynamics of the Volatilization of $Tl_2O$ from $Tl_2O$, $Tl_4O_3$, and $Tl_2O_3$," *J. Phys. Chem.*, vol. 97, No. 16, Apr. 1, 1993, pp. 4224-4230.

*Primary Examiner* — Michael E. La Villa
(74) *Attorney, Agent, or Firm* — Faegre Drinker Biddle & Reath LLP

(57) ABSTRACT

Provided is a plating film containing Au and Tl, including Tl oxides including $Tl_2O$ on a surface of the plating film, a ratio of Tl atoms constituting $Tl_2O$ to a total of Tl atoms constituting the Tl oxides and Tl atoms constituting Tl simple substances on the surface being 40% or more.

5 Claims, 2 Drawing Sheets

(51) Int. Cl.
| | |
|---|---|
| C25D 5/50 | (2006.01) |
| B32B 15/01 | (2006.01) |
| B32B 15/04 | (2006.01) |
| C25D 5/48 | (2006.01) |
| H01L 21/60 | (2006.01) |
| C22C 5/02 | (2006.01) |
| C23C 28/00 | (2006.01) |
| B32B 15/20 | (2006.01) |
| C22C 5/00 | (2006.01) |
| C23C 28/02 | (2006.01) |
| C23C 30/00 | (2006.01) |
| C22C 32/00 | (2006.01) |
| C23C 18/16 | (2006.01) |
| C25D 3/12 | (2006.01) |
| C25D 3/62 | (2006.01) |
| C25D 5/02 | (2006.01) |
| C25D 5/12 | (2006.01) |
| C25D 5/00 | (2006.01) |

(52) U.S. Cl.
CPC ............ *B32B 15/018* (2013.01); *B32B 15/04* (2013.01); *B32B 15/043* (2013.01); *B32B 15/20* (2013.01); *C22C 5/00* (2013.01); *C22C 5/02* (2013.01); *C22C 32/001* (2013.01); *C22C 32/0015* (2013.01); *C23C 28/02* (2013.01); *C23C 28/021* (2013.01); *C23C 28/023* (2013.01); *C23C 28/30* (2013.01); *C23C 28/32* (2013.01); *C23C 28/321* (2013.01); *C23C 28/345* (2013.01); *C23C 30/00* (2013.01); *C23C 30/005* (2013.01); *C25D 3/48* (2013.01); *C25D 5/48* (2013.01); *C25D 5/50* (2013.01); *H01L 21/60* (2021.08); *B32B 2255/06* (2013.01); *B32B 2255/20* (2013.01); *C23C 18/1653* (2013.01); *C25D 3/12* (2013.01); *C25D 3/62* (2013.01); *C25D 5/022* (2013.01); *C25D 5/12* (2013.01); *C25D 5/617* (2020.08); *Y10T 428/1259* (2015.01); *Y10T 428/1266* (2015.01); *Y10T 428/1291* (2015.01); *Y10T 428/12583* (2015.01); *Y10T 428/12611* (2015.01); *Y10T 428/12618* (2015.01); *Y10T 428/12681* (2015.01); *Y10T 428/12868* (2015.01); *Y10T 428/12882* (2015.01); *Y10T 428/12889* (2015.01); *Y10T 428/12903* (2015.01); *Y10T 428/12931* (2015.01); *Y10T 428/12944* (2015.01); *Y10T 428/2495* (2015.01); *Y10T 428/24967* (2015.01); *Y10T 428/26* (2015.01); *Y10T 428/263* (2015.01); *Y10T 428/264* (2015.01); *Y10T 428/265* (2015.01)

(58) Field of Classification Search
CPC ... B32B 15/018; B32B 15/20; B32B 2255/06; B32B 2255/20; C25D 3/48; C25D 3/12; C25D 3/62; C25D 5/48; C25D 5/50; C25D 5/022; C25D 5/12; C25D 5/617; C23C 30/00; C23C 30/005; C23C 18/1653; C23C 28/02; C23C 28/021; C23C 28/023; C23C 28/30; C23C 28/32; C23C 28/321; C23C 28/345; C22C 5/02; C22C 5/00; C22C 32/001; C22C 32/0015; Y10T 428/1266; Y10T 428/12681; Y10T 428/12611; Y10T 428/12618; Y10T 428/12583; Y10T 428/1259; Y10T 428/12889; Y10T 428/12903; Y10T 428/12944; Y10T 428/12868; Y10T 428/12882; Y10T 428/1291; Y10T 428/12931; Y10T 428/26; Y10T 428/263; Y10T 428/264; Y10T 428/265; Y10T 428/24967; Y10T 428/2495
See application file for complete search history.

(56) References Cited

FOREIGN PATENT DOCUMENTS

| JP | H11-243111 A | 9/1999 |
|---|---|---|
| JP | 2006-322037 A | 11/2006 |
| WO | WO-2014/054429 A1 | 4/2014 |

* cited by examiner

SAMPLE No.1-4

SAMPLE No.1-11

PLATING FILM AND PLATED MEMBER

TECHNICAL FIELD

The present disclosure relates to a plating film and a plated member. The present application claims priority to Japanese Patent Application No. 2018-041281 filed on Mar. 7, 2018. The entire contents described in the Japanese patent application are incorporated herein by reference.

BACKGROUND ART

PTL 1 discloses adding thallium as a crystal-adjusting agent into a gold plating film for coating a silver wire.

CITATION LIST

Patent Literature

PTL 1: Japanese Patent Laying-Open No. 11-243111

SUMMARY OF INVENTION

A plating film in accordance with the present disclosure is a plating film containing Au and Tl, including:

Tl oxides including $Tl_2O$ on a surface of the plating film, a ratio of Tl atoms constituting $Tl_2O$ to a total of Tl atoms constituting the Tl oxides and Tl atoms constituting Tl simple substances on the surface being 40% or more.

A plated member in accordance with the present disclosure is a plated member including a base material and a plating film coating the base material, and to be joined to a mating member via an electrically conductive joining material, the plating film being the plating film in accordance with the present disclosure described above.

DETAILED DESCRIPTION

Figure 1:
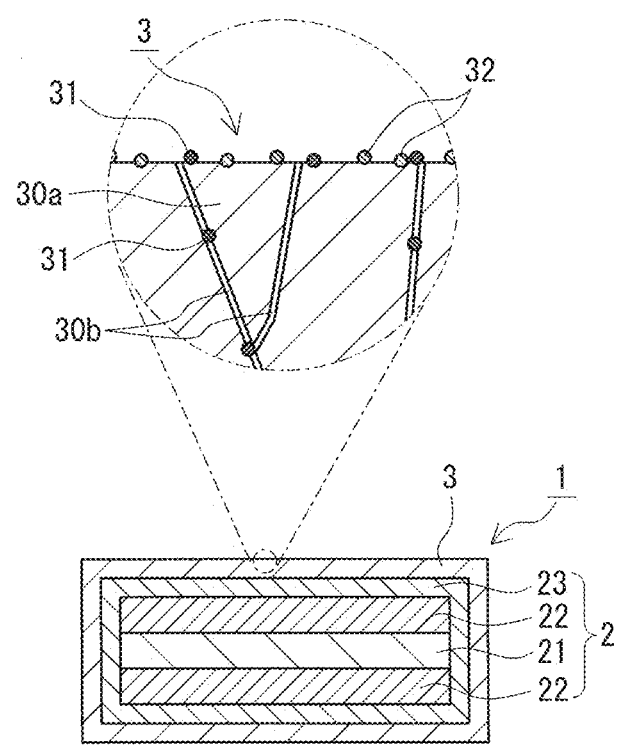
FIG. 1 is a schematic configuration diagram showing a plated member in accordance with an embodiment.

Problem to be Solved by the Present Disclosure

A plated member including a base material coated with a plating film may be joined to a mating member via an electrically conductive joining material such as an Ag paste. On this occasion, it is desired that the plated member has an excellent wettability with the electrically conductive joining material. Specifically, it is desired that, in the plating film of the plated member, the ratio of a wetted area to the total area of a joining region with the electrically conductive joining material (wetted area ratio) is 90% or more. However, conventionally, sufficient consideration has not been given to setting the wetted area ratio to 90% or more in a gold plating film containing thallium.

Accordingly, one object of the present disclosure is to provide a plating film excellent in wettability with an electrically conductive joining material. In addition, another object of the present disclosure is to provide a plated member excellent in wettability with an electrically conductive joining material.

Advantageous Effect of the Present Disclosure

The plating film and the plated member described above are excellent in wettability with an electrically conductive joining material.

Description of Embodiment of the Present Disclosure

First, the contents of an embodiment of the present disclosure will be enumerated.

(1) A plating film in accordance with the embodiment of the present disclosure is a plating film containing Au and Tl, including Tl oxides including $Tl_2O$ on a surface of the plating film, a ratio of Tl atoms constituting $Tl_2O$ to a total of Tl atoms constituting the Tl oxides and Tl atoms constituting Tl simple substances on the surface being 40% or more.

Of the Tl oxides, $Tl_2O$ is excellent in wettability with an electrically conductive joining material. Accordingly, since the ratio of Tl atoms constituting $Tl_2O$ to the total of Tl atoms constituting the Tl oxides and Tl atoms constituting the Tl simple substances on the surface of the plating film is 40% or more, the plating film described above is excellent in wettability with the electrically conductive joining material. Specifically, the plating film described above can satisfy a ratio of a wetted area to the total area of a joining region with the electrically conductive joining material (wetted area ratio) of 90% or more. Due to excellent wettability between the plating film and the electrically conductive joining material, joining property between the plating film and a mating member via the electrically conductive joining material can be improved.

(2) As an example of the plating film described above, a content of Tl contained in the entire plating film is 10 ppm or more and 600 ppm or less in mass ratio.

Since the content of Tl contained in the entire plating film is 10 ppm or more, Tl in the plating film is easily concentrated on the surface and $Tl_2O$ is easily caused to exist on the surface of the plating film, and thus a plating film excellent in wettability with the electrically conductive joining material is easily obtained. When a large amount of Tl is contained inside the plating film, the plating film tends to be easily peeled off from a base material coated therewith. Since the content of Tl contained in the entire plating film is 600 ppm or less, it is possible to fully reduce the content of Tl inside the plating film after Tl is concentrated on the surface of the plating film, and thus peeling off of the plating film from the base material is easily suppressed.

(3) As an example of the plating film described above, the plating film has an average thickness of 0.1 μm or more.

Since the plating film has an average thickness of 0.1 μm or more, corrosion of the base material coated with the plating film due to oxidation or the like is easily suppressed.

(4) A plated member in accordance with the embodiment of the present disclosure is a plated member including a base material and a plating film coating the base material, and to be joined to a mating member via an electrically conductive joining material, the plating film being the plating film according to any of (1) to (3) described above.

Since the plated member described above includes the plating film in accordance with the embodiment of the present disclosure, it is excellent in wettability with the electrically conductive joining material, and is excellent in joining property with the mating member via the electrically conductive joining material. In addition, since the plating film is excellent in wettability with the electrically conductive joining material, a cavity is less likely to be formed between the electrically conductive joining material and the plating film, and heat resistance due to the cavity can be reduced. Since heat resistance of the electrically conductive joining material can be reduced, heat transfer between the mating member and the plated member via the electrically conductive joining material can be satisfactorily performed. For example, when the plated member is a heat dissipation member, the electrically conductive joining material is an Ag paste, and the mating member is a semiconductor chip, heat generated by the semiconductor chip can be released to the heat dissipation member via the electrically conductive joining material, and thus a failure of the semiconductor chip can be prevented.

(5) As an example of the plated member described above, the base material includes a plate material, and a film composed mainly of Ni coating the plate material, and the plate material is made of a metal including one type or more selected from Cu, Ag, Al, Mo, W, and Mg, or a composite material including one type or more selected from Cu, Ag, Al, Mo, W, and Mg and one type or more selected from diamond and silicon carbide.

According to the configuration described above, the plated member itself is excellent in heat dissipation property. In addition, since the plate material as a main constituting member of the base material is coated with the film composed mainly of Ni, corrosion of the base material due to oxidation or the like is easily suppressed.

Details of Embodiment of the Present Disclosure

Hereinafter, a plating film in accordance with the embodiment of the present disclosure, and a plated member including the plating film will be specifically described with reference to FIG. 1. It should be noted that the present disclosure is not limited to these examples; rather, it is defined by the scope of the claims, and is intended to include any modifications within the scope and meaning equivalent to the scope of the claims. In addition, in the present specification, an expression in the form of "A to B" means upper and lower limits of a range (that is, A or more and B or less), and when A is not accompanied by any unit and B is alone accompanied by a unit, A has the same unit as B.

<<Plating Film>>

A plating film 3 in accordance with the embodiment contains Au and Tl. Plating film 3 in accordance with the embodiment has one characteristic that it includes Tl oxides 32 including $Tl_2O$ on a surface of plating film 3, and a ratio of Tl atoms constituting $Tl_2O$ to a total of Tl atoms constituting the Tl oxides and Tl atoms constituting Tl simple substances on the surface of plating film 3 is 40% or more. Hereinafter, the ratio of Tl atoms constituting $Tl_2O$ to the total of Tl atoms constituting Tl oxides 32 and Tl atoms constituting Tl simple substances 31 on the surface of plating film 3 is also referred to as a "ratio X".

Plating film 3 is composed mainly of gold (Au). Being composed mainly of Au means containing 99% by mass or more of Au, and plating film 3 may be pure Au, or may be an Au alloy including one type or more selected from Co, Ni, Fe, Cu, Sn, Ag, and the like. Plating film 3 composed mainly of Au is excellent in electrical conductivity, joining property with a mating member via an electrically conductive joining material, corrosion resistance, and the like.

Plating film 3 contains thallium (Tl). Tl is contained as a crystal-adjusting agent, as described in detail in a method for manufacturing the plating film described later. Tl exists within a crystal grain 30a and in crystal grain boundaries 30b of Au inside plating film 3, and exists on the surface of plating film 3. Tl existing inside plating film 3 typically exists as Tl simple substances 31. Tl existing on the surface of plating film 3 typically exists as Tl simple substances 31 and Tl oxides 32. It should be noted that, in FIG. 1, for ease of understanding, Tl simple substances 31 and Tl oxides 32 are shown to have the same size and appropriate spacings, and are different in size and spacing from actual Tl simple substances and Tl oxides.

Tl simple substances 31 and Tl oxides 32 existing on the surface of plating film 3 are formed because Tl simple substances 31 existing inside plating film 3 move to the surface of plating film 3 in the process of manufacturing plating film 3, as described in detail in the method for manufacturing the plating film described later. Accordingly, Tl contained in plating film 3 is concentrated on the surface of plating film 3, and mainly exists as Tl simple substances 31 and Tl oxides 32 on the surface of plating film 3.

Tl oxides 32 existing on the surface of plating film 3 include $Tl_2O$ and $Tl_2O_3$. $Tl_2O$ contributes to improvement in the wettability between plating film 3 and the electrically conductive joining material. On the other hand, $Tl_2O_3$ reduces the wettability between plating film 3 and the electrically conductive joining material. In addition, Tl simple substances 31 also reduce the wettability between plating film 3 and the electrically conductive joining material.

$Tl_2O$ existing on the surface of plating film 3 is exposed from the surface of plating film 3. $Tl_2O$ existing on the surface of plating film 3 exists such that it adheres to the surface of plating film 3, or a portion thereof is embedded in plating film 3 and the remaining portion is exposed from plating film 3. $Tl_2O$ only has to be embedded in plating film 3 to such an extent that it can be held by plating film 3, and it is preferable that the portion exposed from plating film 3 is larger. Contact between the exposed portion of $Tl_2O$ and the electrically conductive joining material can improve the wettability.

As described above, ratio X is 40% or more in the present embodiment. Since ratio X is 40% or more, the wettability with the electrically conductive joining material can be improved, and the joining property with the mating member via the electrically conductive joining material can be improved. The more the value of ratio X is, the more the wettability with the electrically conductive joining material can be improved, and thus ratio X is 50% or more, further 60% or more, or in particular 80% or more, by way of example. It should be noted that, when ratio X exceeds a certain amount, the wettability (wetted area ratio) may be saturated.

Ratio X can be measured by X-ray photoelectron spectroscopy (XPS). As for the Tl oxides, two types, that is, $Tl_2O$ and $Tl_2O_3$, may exist. In a narrow scan spectrum measured by XPS in the range of 110 eV to 135 eV in 0.2 eV increments, the peak of the Tl simple substances and the peak of $Tl_2O_3$ are detected at substantially the same position, and the intensity at 117.4 eV can be regarded as a height A of the intensity of the summed peak of the Tl simple substances and $Tl_2O_3$. On the other hand, the peak of $Tl_2O$ is detected to be separated from the peak of the Tl simple substances and the peak of $Tl_2O_3$, and the intensity at 118.6 eV can be regarded as a height B of the intensity of the peak of $Tl_2O$. In the present application, ratio X is calculated as a ratio between the heights of the intensities of the peaks ($\{B/(A+B)\}\times 100$).

A content of Tl contained in entire plating film 3 is 10 to 600 ppm in mass ratio, by way of example. Since the content of Tl contained in entire plating film 3 is 10 ppm or more, Tl in plating film 3 is easily concentrated on the surface of plating film 3, and $Tl_2O$ is easily caused to exist on the surface of plating film 3. On the other hand, since the content of Tl contained in entire plating film 3 is 600 ppm or less, it is possible to fully reduce the content of Tl inside plating film 3 after Tl is concentrated on the surface of plating film 3 in the process of manufacturing plating film 3, and thus peeling off of plating film 3 from the base material coated with plating film 3 is easily suppressed. It should be noted that ratio X has no substantial correlation with the content of Tl contained in entire plating film 3. The content of Tl contained in entire plating film 3 can be measured for example by performing inductively coupled plasma (ICP) emission spectral analysis. Specifically, plating film 3 is dissolved by an acid or the like, and ICP emission spectral analysis is performed using a dissolved solution as a sample. The content of Tl contained in entire plating film 3 is further 30 to 500 ppm, or in particular 60 to 400 ppm, by way of example.

Plating film 3 has an average thickness of 0.1 μm or more, by way of example. Since plating film 3 has an average thickness of 0.1 μm or more, corrosion of a base material 2 coated with plating film 3 due to oxidation or the like is easily suppressed. On the other hand, since an increase in the average thickness of plating film 3 leads to an increase in cost and a decrease in industrial productivity, plating film 3 has an average thickness of 5.0 μM or less, by way of example. The average thickness of plating film 3 is obtained for example by observing cross sections in a thickness direction of plating film 3 at a plurality of locations (for example, five locations or more) using a scanning electron microscope (SEM) with a field of view of 3000 times, measuring thicknesses of plating film 3 at a plurality of uniformly spaced points (for example, ten points or more) in each microphotograph, and calculating an average in all the microphotographs. The average thickness of plating film 3 is further 0.3 to 3.0 μm, or in particular 0.5 to 2.0 μm, by way of example.

<<Plated Member>>

Plating film 3 described above coats base material 2 and thereby constitutes a plated member 1. Plated member 1 in accordance with the embodiment is joined to the mating member via the electrically conductive joining material. Plated member 1 is a member to be mounted on a semiconductor device, for example. Specifically, plated member 1 is a semiconductor chip, or a heat dissipation member equipped with a semiconductor chip. The electrically conductive joining material is an Ag paste, by way of example.

Base material 2 includes a plate material, and a film 23 composed mainly of Ni coating the plate material. The plate material is made of a metal including one type or more selected from Cu, Ag, Al, Mo, W, and Mg, or a composite material including one type or more selected from Cu, Ag, Al, Mo, W, and Mg and one type or more selected from diamond and silicon carbide, by way of example. In the present example, the plate material has a stacked structure in which a first metal plate 21, which is a metal plate containing Cu and is made of a Cu alloy, is sandwiched between a pair of second metal plates 22 made of Cu simple substances. As an average thickness of each of first metal plate 21 and second metal plates 22, a desired thickness can be selected as appropriate. Film 23 composed mainly of Ni entirely coats surfaces of the plate material. Being composed mainly of Ni means containing 90% by mass or more of Ni, and film 23 may be pure Ni, or may be a Ni alloy including one type or more selected from Co, Pd, and the like. Film 23 composed mainly of Ni may be formed by a plating method such as Ni electroplating, Ni-P electroless plating, or Ni—B electroless plating, or may be formed by a physical vapor deposition method such as a sputtering method or a vapor deposition method. Film 23 composed mainly of Ni has an average thickness of 1.0 to 10 μm, for example. In addition, plating film 3 entirely coats a surface of film 23 composed mainly of Ni. It should be noted that, in FIG. 1, for ease of understanding, each member is shown to have a thickness larger than an actual thickness. The material and the structure of base material 2 are not particularly limited, as long as base material 2 is a member which can be coated with plating film 3 in accordance with the embodiment.

Since plated member 1 in accordance with the embodiment includes plating film 3 in accordance with the embodiment described above on surfaces of base material 2, it is excellent in the wettability with the electrically conductive joining material. Specifically, in plated member 1 in accordance with the embodiment, a wetted area ratio with respect to the electrically conductive joining material is 90% or more. The wetted area ratio is the ratio of a wetted area to the total area of a joining region between plating film 3 and the electrically conductive joining material. The wetted area ratio with respect to the electrically conductive joining material in plating film 3 can be measured for example by observing a sample which is plated member 1 having the electrically conductive joining material adhering thereto using an optical microscope, and performing image analysis on a microphotograph thereof. Since the wetted area ratio described above is 90% or more, a cavity is less likely to be formed in a joining portion between plated member 1 and the mating member, and plated member 1 can be satisfactorily joined to the mating member.

<<Method for Manufacturing Plating Film and Method for Manufacturing Plated Member>>

Plating film 3 and plated member 1 described above can be manufactured by a process including a plating step, a heat treatment step, and an oxidation step.

[Plating Step]

In the plating step, plating is performed on at least a portion of surfaces of a plating target, using a plating bath containing Au and Tl, until a plating film has a desired thickness. The plating target is, for example, base material 2 in which film 23 composed mainly of Ni coats the surfaces of the plate material (see FIG. 1). The plating method is, for example, electrolytic plating in which the plating target (base material 2) is immersed in the plating bath for electrodeposition. When the plating is performed on only a portion of the plating target (base material 2), masking is provided to a region on which the plating is not performed.

Tl contained in the plating bath is contained as a crystal-adjusting agent. As the crystal-adjusting agent, thallium formate, thallium malonate, thallium sulfate, thallium nitrate, thallium cyanate, or the like is used, for example. The content of Tl contained in the plating bath is 0.5 to 30 ppm, by way of example. Since the content of Tl contained in the plating bath is 0.5 ppm or more, the content of Au can be relatively reduced, and the cost of the plating bath can be reduced. In addition, complexes of Au contained in the plating bath can be stabilized, and the life of the plating bath is improved and control of components constituting the plating bath can be facilitated. On the other hand, since the content of Tl contained in the plating bath is 30 ppm or less, the plating film is easily formed uniformly on the plating target (base material 2). As a composition of the plating bath, a composition of a well-known plating bath can be utilized.

The content of Tl contained in the formed plating film, the thickness of the plating film, and the like can be adjusted by adjusting plating conditions for the plating bath, for example, by adjusting the value of a current to be applied to the plating bath, the temperature of the plating bath, and the like. Specifically, the content of Tl contained in the formed plating film can be increased by increasing the value of the current to be applied to the plating bath, and decreasing the temperature of the plating bath. The plating conditions for the plating bath are adjusted such that the content of Tl contained in the entire formed plating film is 10 to 600 ppm, by way of example.

In the plating film formed by the plating step described above, Tl exists substantially uniformly in the thickness direction of the plating film. Specifically, Tl contained in the plating film formed by the plating step mainly exists as Tl simple substances in crystal grain boundaries of Au and may also exist within crystal grains of Au, inside the plating film. Hereinafter, the plating film formed by the plating step is referred to as a first plating film, and a plated member including the first plating film is referred to as a first plated member.

[Heat Treatment Step]

In the heat treatment step, the first plated member described above is heat-treated in an atmosphere which does not substantially contain an oxygen element. By heat-treating the first plated member, Tl existing inside the first plating film is concentrated on a surface of the first plating film. Specifically, by heat-treating the first plated member, Au in the first plating film is recrystallized, and thereby Tl which mainly exists in the crystal grain boundaries of Au moves to the surface of the first plating film.

The atmosphere which does not substantially contain the oxygen element means an atmosphere having an oxygen concentration of 20 ppm or less in mass ratio. The atmosphere which does not substantially contain the oxygen element is an $H_2$ gas atmosphere, an inert gas atmosphere such as an Ar or $N_2$ atmosphere, a mixed gas atmosphere of the $H_2$ gas and an inert gas, or the like, by way of example.

The heat treatment temperature is 200 to 500° C., by way of example. By setting the heat treatment temperature to 200° C. or more, Au in the first plating film can be recrystallized, and at least a portion of Tl existing in the crystal grain boundaries of Au can be moved to the surface of the first plating film as Au is recrystallized. The higher the heat treatment temperature is, the more Tl existing in the crystal grain boundaries of Au can be moved to the surface of the first plating film. On the other hand, by setting the heat treatment temperature to 500° C. or less, Ni in base material 2, that is, Ni in film 23 composed mainly of Ni can be suppressed from being diffused to the surface of the first plating film. The heat treatment temperature is further 250 to 480° C., or in particular 300 to 450° C., by way of example.

The time for maintaining heat treatment is 1 to 10 minutes, by way of example. By setting the time for maintaining the heat treatment to 1 minute or more, Au in the first plating film can be recrystallized, and at least a portion of Tl existing in the crystal grain boundaries of Au can be moved to the surface of the first plating film as Au is recrystallized. The longer the time for maintaining the heat treatment is, the more Tl existing in the crystal grain boundaries of Au can be moved to the surface of the first plating film. Au in the first plating film is fully recrystallized if the time for maintaining the heat treatment is set to 10 minutes. Accordingly, manufacturing time can be shortened by setting the time for maintaining the heat treatment to 10 minutes or less. The time for maintaining the heat treatment is further 2 to 8 minutes, or in particular 3 to 5 minutes, by way of example.

In a plating film obtained by performing the heat treatment step on the first plating film, Tl is concentrated on a surface of the plating film. Tl existing on the surface of this plating film mainly exists as Tl simple substances immediately after the heat treatment. Hereinafter, the plating film obtained by performing the heat treatment step on the first plating film is referred to as a second plating film, and a plated member including the second plating film is referred to as a second plated member.

[Oxidation Step]

In the oxidation step, the second plated member described above is left in an atmosphere containing the oxygen element. By leaving the second plated member in the atmosphere containing the oxygen element, Tl existing on a surface of the second plating film is oxidized to form Tl oxides. The Tl oxides include $Tl_2O$ and $Tl_2O_3$.

The atmosphere containing the oxygen element means an atmosphere having an oxygen concentration of 500 ppm or more in mass ratio. The atmosphere containing the oxygen element is an atmospheric air, by way of example. Preferably, the second plated member is left in the atmosphere containing the oxygen element at ordinary temperature, because performing the oxidation step in the atmospheric air at ordinary temperature does not require special atmosphere control and temperature control. The time for leaving the second plated member in the atmosphere containing the oxygen element is 1 to 24 hours, by way of example. By setting the leaving time to 1 hour or more, of Tl existing on the surface of the second plating film, 40% or more of Tl can be oxidized to $Tl_2O$. The remaining portion of Tl existing on the surface of the second plating film exists as Tl simple substances or is oxidized to $Tl_2O_3$. The longer the time for leaving the second plated member in the atmosphere containing the oxygen element is, the more likely Tl existing on the surface of the second plating film is oxidized to $Tl_2O$. It should be noted that, when the leaving time exceeds a certain length, oxidation to $Tl_2O$ may be saturated. Tl in the second plating film can be fully oxidized to $Tl_2O$ if the time for leaving the second plated member in the atmosphere containing the oxygen element is set to 24 hours. Accordingly, manufacturing time can be shortened by setting the time for leaving the second plated member in the atmosphere containing the oxygen element to 24 hours or less. It should be noted that oxidation of Tl depends on external factors such as humidity. Accordingly, the time for leaving the second plated member in the atmosphere containing the oxygen element may be adjusted as appropriate according to the external factors. For example, in the case of high humidity, Tl existing on the surface of the second plating film is easily oxidized to $Tl_2O$, and thus the leaving time can be shortened. The time for leaving the second plated member in the atmosphere containing the oxygen element is further 3 to 20 hours, or in particular 6 to 16 hours, by way of example.

Plating film 3 obtained by performing the oxidation step on the second plating film includes Tl oxides 32 including $Tl_2O$ on the surface of plating film 3, as shown in FIG. 1. Ratio X in plating film 3 is 40% or more. It should be noted that Tl on the surface of plating film 3 only has to exist as $Tl_2O$ by 40% or more, and the remaining portion of Tl may take any form.

<<Effect>>

Since plating film 3 in accordance with the embodiment includes Tl oxides 32 including $Tl_2O$ on the surface thereof, and ratio X is 40% or more on the surface of plating film 3, the wettability with the electrically conductive joining material can be improved. Specifically, plating film 3 described above can satisfy a wetted area ratio with respect to the electrically conductive joining material of 90% or more. Therefore, plated member 1 in accordance with the embodiment including plating film 3 described above can improve the joining property with the mating member via the electrically conductive joining material. Since a wetted area ratio of 90% or more is satisfied, a cavity is less likely to be formed in the joining portion between plated member 1 and the mating member, and heat resistance which may occur in the joining portion can be reduced. Thereby, for example when plated member 1 is a heat dissipation member and the mating member is a semiconductor chip, heat generated by the semiconductor chip can be satisfactorily released to the heat dissipation member, and thus a failure of the semiconductor chip can be prevented.

Since the content of Tl contained in entire plating film 3 is 10 ppm or more in plating film 3 in accordance with the embodiment, Tl in plating film 3 is easily concentrated on the surface, and $Tl_2O$ is easily caused to exist on the surface of plating film 3. Since Tl contained in plating film 3 mainly exists on the surface of plating film 3 and exists less inside plating film 3, peeling off of plating film 3 from the mating member coated with plating film 3 can be suppressed.

TEST EXAMPLE 1

Samples of plated members each including a plating film containing Au and Tl were fabricated to examine the ratio of $Tl_2O$ existing on a surface of the plating film and the wetted area ratio of each sample.

<<Fabrication of Samples>>

Electrolytic plating was performed on surfaces of each plating target using a plating bath containing Au and Tl (samples Nos. 1-1 to 1-4, 1-11). As the plating target, a base material formed by preparing a metal plate having a stacked structure in which a first metal plate made of a Cu—Mo based alloy was sandwiched between second metal plates made of Cu simple substances, and coating surfaces of the metal plate with a film composed mainly of Ni (Ni electroplating film) was used (see FIG. 1). The base material had a size of 5.0 mm×5.0 mm×1.0 mm. As the plating bath, a plating bath prepared by adjusting potassium gold cyanide and thallium nitrate was used. The electrolytic plating was performed under plating conditions of a Tl concentration of 10 ppm in mass ratio, a current density of 0.5 A/dm², and a plating bath temperature of 60° C., until a plating film had a thickness of 1.5 μm. The content of Tl in the entire plating film obtained under these plating conditions was 35 ppm in mass ratio.

Each sample subjected to the electrolytic plating on the surfaces of the base material was subjected to heat treatment at 310° C. for 1 minute in a $H_2$ gas atmosphere. Of the samples subjected to the heat treatment, samples Nos. 1-1 to 1-4 were left in an atmospheric air at ordinary temperature for leaving times shown in Table 1. Then, an Ag paste was applied to samples Nos. 1-1 to 1-4. As a method for applying the Ag paste, 50 μl of the Ag paste was dropped on each sample, and then the droplet was spread using a squeegee. The squeegeed height was 30 μm. Of the samples subjected to the heat treatment, sample No. 1-11 was not left in the atmospheric air at ordinary temperature, and the Ag paste was applied thereto immediately after the heat treatment. In any of the samples, the area of applying the Ag paste was set to 3.0 mm×2.5 mm.

<<Ratio of $Tl_2O$ on Surface of Plating Film>>

For the plated member of each fabricated sample, the ratio of Tl atoms constituting $Tl_2O$ to the total of Tl atoms constituting Tl oxides and Tl atoms constituting Tl simple substances on a surface of the plated member was measured by XPS. Table 1 also shows the result thereof.

<<Wetted Area Ratio>>

Figure 2:
FIG. 2 is a photograph showing a wetted state between a plated member of sample No. 1-4 in test example 1 and an electrically conductive joining material.
Figure 3:
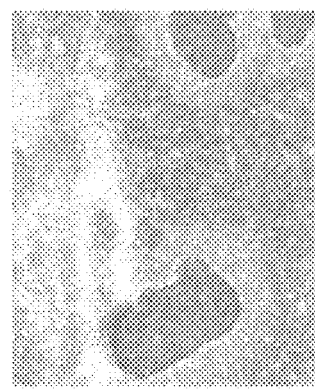
FIG. 3 is a photograph showing a wetted state between a plated member of sample No. 1-11 in test example 1 and the electrically conductive joining material.

For the plated member of each fabricated sample, the wetted area ratio between the plating film and the Ag paste was measured. As the wetted area ratio, the ratio of an area where the Ag paste was wetted within the area of applying the Ag paste was determined using an optical microscope. Table 1 also shows the result thereof. In addition, FIGS. 2 and 3 show photographs showing wetted states of the Ag paste with respect to the plating film, for the plated members of samples Nos. 1-4 and 1-11, respectively. In FIGS. 2 and 3, a black portion represents a portion repelling the Ag paste, and a portion other than that is a portion where the Ag paste is wetted.

TABLE 1

| Sample No. | Leaving Time in Oxidation Step [hr] | Ratio of $Tl_2O$ on Surface of Plating Film [%] | Wetted Area Ratio [%] |
|---|---|---|---|
| 1-1 | 0.5 | 32 | 85 |
| 1-2 | 2 | 53 | 95 |
| 1-3 | 8 | 78 | 98 |
| 1-4 | 24 | 99 | 97 |
| 1-11 | 0 | 28 | 80 |

As shown in Table 1, in samples Nos. 1-2 to 1-4 which were left for 1 hour or more after the heat treatment and then to which the Ag paste was applied, the ratio of Tl atoms constituting $Tl_2O$ to the total of Tl atoms constituting the Tl oxides and Tl atoms constituting the Tl simple substances on the surface of the plating film was 40% or more, and the wetted area ratio was 90% or more, indicating that they are excellent in wettability. This seems to be because these samples were left for 1 hour or more after the heat treatment and thus Tl concentrated on the surface of the plating film by the heat treatment was fully oxidized. On the other hand, in sample No. 1-1 which was left for less than 1 hour after the heat treatment and then to which the Ag paste was applied, the above ratio was 32%, and the wetted area ratio was 85%, indicating that it is inferior in wettability. In addition, in sample No. 1-11 to which the Ag paste was applied immediately after the heat treatment, the above ratio was 28%, and the wetted area ratio was 80%, indicating that it is further inferior in wettability. This seems to be because these samples were left for a short period of time or were not left after the heat treatment, and thus Tl concentrated on the surface of the plating film by the heat treatment was not fully oxidized, and Tl reducing wettability, such as Tl simple substances and $Tl_2O_3$, remained on the surface of the plating film.

TEST EXAMPLE 2

Samples of plated members each including a plating film containing Au and Tl were fabricated to examine the content of Tl contained in the entire plating film and the wetted area ratio of each sample.

<<Fabrication of Samples>>

Electrolytic plating was performed on surfaces of each plating target using a plating bath containing Au and Tl (samples Nos. 2-1 to 2-4). As the plating target, the same base material as that in test example 1 was used. As the plating bath, a plating bath prepared by adjusting potassium gold cyanide and thallium nitrate as in test example 1 was used. As plating conditions, Tl concentrations (in mass ratio), current densities, and temperatures shown in FIG. 2 were used. Table 2 also shows the content of Tl in each entire plating film obtained under the plating conditions. In any of the samples, the plating film had a thickness of 1 μm.

Each sample subjected to the electrolytic plating on the surfaces of the base material was subjected to heat treatment at 310° C. for 1 minute in a $H_2$ gas atmosphere. Thereafter, each sample was left in an atmospheric air at ordinary temperature for 14 hours, and then, an Ag paste was applied thereto as in test example 1. In any of the samples, the area of applying the Ag paste was set to 3.0 mm×2.5 mm.

<<Content of Tl>>

For the plated member of each fabricated sample, the content of Tl contained in the entire plating film was measured by ICP emission spectral analysis. Table 2 also shows the result thereof.

<<Wetted Area Ratio>>

For the plated member of each fabricated sample, the wetted area ratio between the plating film and the Ag paste was measured as in test example 1. Table 2 also shows the result thereof.

TABLE 2

| Sample No. | Plating Conditions | | | Amount of Tl in Entire Plating Film [ppm] | Wetted Area Ratio [%] |
|---|---|---|---|---|---|
| | Tl Concentration [ppm] | Temperature [° C.] | Current Density [A/dm²] | | |
| 2-1 | 10 | 60 | 0.5 | 35 | 99 |
| 2-2 | 10 | 60 | 0.8 | 92 | 95 |
| 2-3 | 10 | 40 | 0.5 | 320 | 96 |
| 2-4 | 15 | 40 | 0.5 | 590 | 97 |

As shown in Table 2, it has been found that the wetted area ratio does not depend on the content of Tl contained in the entire plating film. This seems to be because, in a case where a certain amount of Tl is contained in the plating film, when the plating film is fully left after the heat treatment, Tl concentrated on the surface of the plating film by the heat treatment is fully oxidized. Since the wetted area ratio does not depend on the content of Tl contained in the entire plating film, it is expected that, by increasing the content of Tl contained in the entire plating film, the content of Au can be relatively reduced, and the cost of the plating bath can be reduced. In addition, it is also expected that, by increasing the content of Tl contained in the entire plating film, complexes of Au in the plating bath can be stabilized, and the life of the plating bath is improved and control of components constituting the plating bath can be facilitated.

REFERENCE SIGNS LIST

1: plated member; 2: base material: 21: first metal plate; 22: second metal plate; 23: film composed mainly of Ni; 3: plating film; 30*a*: crystal grain; 30*b*: crystal grain boundary; 31: Tl simple substance; 32: Tl oxide.

The invention claimed is:

1. A plating film containing Au and Tl, comprising:
Tl oxides including $Tl_2O$ on a surface of the plating film,
a ratio of Tl atoms constituting $Tl_2O$ to a total of Tl atoms constituting the Tl oxides and Tl atoms constituting zero valent Tl on the surface being 40% or more.

2. The plating film according to claim 1, wherein a content of Tl contained in the entire plating film is 10 ppm or more and 600 ppm or less in mass ratio.

3. The plating film according to claim 1, wherein the plating film has an average thickness of 0.1 μm or more.

4. A plated member comprising a base material and a plating film coating the base material, and to be joined to a mating member via an electrically conductive joining material,
the plating film being the plating film according to claim 1.

5. The plated member according to claim 4, wherein
the base material includes a plate material, and a film composed mainly of Ni coating the plate material, and
the plate material is made of a metal including one type or more selected from Cu, Ag, Al, Mo, W, and Mg, or a composite material including one type or more selected from Cu, Ag, Al, Mo, W, and Mg and one type or more selected from diamond and silicon carbide.

* * * * *